(12) United States Patent
Liang et al.

(10) Patent No.: US 6,566,703 B1
(45) Date of Patent: May 20, 2003

(54) HIGH SPEED FLASH MEMORY WITH HIGH COUPLING RATIO

(75) Inventors: Mong-Song Liang, Hsin Chu (TW); Ching-Hsiang Hsu, Hsin-Chu (TW); Ruei-Ling Lin, Kaohsiung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 35 days.

(21) Appl. No.: 09/665,745

(22) Filed: Sep. 20, 2000

Related U.S. Application Data

(60) Continuation-in-part of application No. 09/282,061, filed on Mar. 29, 1999, now abandoned, which is a division of application No. 08/939,970, filed on Sep. 29, 1997, now Pat. No. 5,923,974.

(51) Int. Cl.[7] .................. H01L 29/76; H01L 29/788
(52) U.S. Cl. .................. 257/314; 257/315; 257/316
(58) Field of Search ................. 257/314–324; 438/257–265

(56) References Cited

U.S. PATENT DOCUMENTS

| 5,554,544 A | 9/1996 | Hsu | 437/35 |
| 5,556,799 A | 9/1996 | Hong | 437/43 |
| 5,796,140 A | * 8/1998 | Tomioka | 257/315 |

OTHER PUBLICATIONS

Yosiaki S. Hisamune et al. A High Capacitive–Coupling Ratio(HiCR) Cell For 3V Only 64 Mbit and Future Flash Memories, 1993, IEDM p. 93–19–93–22.

Wolf, "Silicon Processing For The VLSI Era, " vol. 3, Lattice Press, Sunset Beach, CA 1995, p634–645.

* cited by examiner

Primary Examiner—Cwong Quang Nguyen
(74) Attorney, Agent, or Firm—George O. Saile; Stephen B. Ackerman; Graham S. Jones II

(57) ABSTRACT

A flash memory device includes floating gate electrode, an interelectrode dielectric layer and a control gate electrode. The interelectrode dielectric layer is formed on top of the floating gate electrode and the control gate electrode is formed on top of the interelectrode dielectric layer. A doped silicon semiconductor substrate is covered with variable thickness silicon oxide regions on the surface thereof with junctions between the variable thickness regions. The silicon oxide regions are substantially thicker beneath the center of the floating gate electrode. Source/drain regions formed in the substrate extend beneath the tunnel oxide regions with the junctions aligned with the regions. The floating gate electrodes formed over the silicon oxide regions above the source/drain regions including dielectric sidewalls within the floating gate electrode above the junctions. The variable thickness silicon oxide regions are tunnel oxide regions on either side of a gate oxide region. The floating gate electrode is composed of doped polysilicon and the dielectric sidewalls is reoxidized polysilicon dielectric regions formed within the floating gate electrode above the junctions of the tunnel oxide regions and the gate oxide region.

15 Claims, 6 Drawing Sheets

|  | WL1 | WL2 | BL1 | BL2 | SL |
|---|---|---|---|---|---|
| Program | 0V | -10V | 3~6V | open | open |
| Erase | 8~10V | 0V | 0V | 0V | 0V |
| Read | 3V | 0V | 1~2V | 0V | 0V |

HIGH SPEED FLASH MEMORY WITH HIGH COUPLING RATIO

This application is a continuation-in-part of Ser. No. 09/282,061, filed on Mar. 29, 1999 now abandoned, which is a divisional of Ser. No. 8/939,970, filed on Sept. 29, 1997, now issued as U.S. Pat. No. 5,923,974, assigned to a common assignee.

BACKGROUND OF THE INVENTION

1. Field of the Invention

This invention relates to semiconductor memory devices and more particularly to flash memory devices with a high coupling ratio and a method of manufacture thereof.

2. Description of Related Art

In the current state of the art, contactless drain (buried diffusion) results in low read currents which is not suitable for high speed random access devices.

U.S. Pat. No. 5,556,799 of Hong for a "Process for Fabricating A Flash EEPROM" Hong teaches that as flash EEPROM devices are made with finer resolutions, floating gate surface areas shrink. This decreases the capacitance of the effective capacitor between the floating gate layer and the control gate layer. The unwanted decrease in effective capacitance results in a reduction in the coupling ratio, which is a parameter that describes the coupling to the floating gate of the voltage present at the control gate of the device. The poor coupling of voltage to a floating gate limits the programming and accessing speed of the flash EEPROM device.

U.S. Pat. No. 5,554,544 of Hsu shows a non-uniform gate oxide created by the field oxide. However, the method/structure differs from the present invention.

Yosiaki S. Hisamune, et al., "A High Capacitive—Coupling Ratio (HiCR) Cell For 3V Only 64 Mbit And Future Flash Memories", (1993) IEDM pp. 93-19 to 93-22 describes at page 93-19 "gate dielectrics consist of 20-nm thick thermal oxide grown on the channel region and 7.5-nm thick silicon oxynitride formed underneath the floating-gate sidewalls. The cell is designed to have ultra small tunneling regions (0.2 µm×0.4 µm) and a large floating gate area (1.4 µm×0.4 µm) in order to obtain the high capacitive-coupling ratio of 0.8. Here the capacitive coupling ratio $CR_E$ is defined by $$C_{RE} = \frac{C_{FG}}{C_T}$$

"where $C_{FG}$ is the capacitance of the interpoly oxide-nitride-oxide (ONO) dielectrics between the control gate and the floating gate and $C_T$ is the total capacitance of the floating gate."

SUMMARY OF THE INVENTION

An object of this invention is to achieve a high coupling ratio.

Another object of this invention is to provide a non-uniform gate oxide to a achieve a high coupling ratio.

A CMOS compatible process is provided which requires only one additional mask. There is a high coupling ratio due to the non-uniform gate oxide. In addition, a Large Angle Tilted Implant (LATI) process is employed to extend the N+ region to a thicker gate oxide.

In accordance with this invention, a semiconductor memory device with floating gate electrode, an interelectrode dielectric layer and a control gate electrode includes a doped silicon semiconductor substrate covered with variable thickness silicon oxide regions on the surface thereof, the silicon oxide regions being substantially thicker beneath the center of the floating gate electrode, and source/drain regions in the substrate extending beneath the tunnel oxide regions.

Preferably, the variable thickness silicon oxide regions comprise tunnel oxide regions on either side of a gate oxide region, the floating gate electrode being composed of doped polysilicon and including reoxidized polysilicon dielectric regions formed in the floating gate electrode above the junctions of the tunnel oxide regions and the gate oxide region; the silicon oxide comprises a tunnel oxide layer with a thickness from about 80 Å to about 100 Å and a gate oxide layer with a thickness from about 150 Å to about 200 Å; and/or the floating gate is formed with sections reaching down on either side of the reoxidized dielectric regions to the gate oxide region layer and to the tunnel oxide region layers.

Further in accordance with this invention, a semiconductor memory device includes the following. A doped silicon semiconductor substrate has alternating silicon oxide regions formed on the surface thereof. The alternating silicon oxide regions comprising alternating tunnel oxide layer regions and gate oxide layer regions formed on the surface of the substrate with the gate oxide region layers being substantially thicker than the tunnel oxide layer regions. A floating gate electrode is centered over a the gate oxide region and over the tunnel oxide regions on either side of the gate oxide region. Source/drain regions in the substrate extending beneath the tunnel oxide regions.

Preferably, the floating gate electrode is composed of doped polysilicon and includes reoxidized polysilicon dielectric regions formed in the floating gate electrode above the junctions of the tunnel oxide regions and the gate oxide region; the silicon oxide comprises a tunnel oxide layer with a thickness from about 80 Å to about 100 Å and a gate oxide layer with a thickness from about 150 Å to about 200 Å, and/or the floating gate is formed with sections reaching down on either side of the reoxidized dielectric regions to the gate oxide region layer and to the tunnel oxide region layers.

BRIEF DESCRIPTION OF THE DRAWINGS

The foregoing and other aspects and advantages of this invention are explained and described below with reference to the accompanying drawings, in which:

FIG. 1 shows a flash memory device in accordance with this invention in an early stage of manufacture.

FIG. 2 shows the device of FIG. 1 after patterning a silicon nitride layer by etching through openings in a mask to produce windows over portions of the first doped polysilicon layer; and after the photoresist mask has been stripped from the silicon nitride layer leaving it exposed with windows in the silicon nitride layer over portions of the first polysilicon layer.

FIG. 3 shows the device of FIG. 2 after the first polysilicon layer and tunnel oxide layer have been etched away beneath windows to produce slots therein below openings in FIG. 2.

FIG. 4 shows the device of FIG. 3 after a set of gate oxide regions were formed in and on the exposed surface of substrate linking the sections of the tunnel oxide layer.

FIG. 5 shows the device of FIG. 4 after forming a second polysilicon conductor layer in a blanket deposition step covering the entire device.

FIG. 6 shows the device of FIG. 5 after the second polysilicon layer is etched back in thickness filling the slots formed as shown in FIG. 3 with convex shapes which are lowest between the silicon nitride/first polysilicon stacks.

FIG. 7 shows the device of FIG. 6 after the silicon nitride segments have been stripped away from the device leaving the second-polysilicon-layer stripes extending above the polysilicon reoxide silicon oxide sidewalls as well as the first polysilicon layer.

FIG. 8 shows the device of FIG. 7 after formation of a third polysilicon layer, a conventional ONO interconductor dielectric layer, a fourth polysilicon (word line) layer, and a photoresist mask (for patterning gate conductor stacks) with windows therethrough down to the surface of fourth polysilicon layer.

FIG. 9 shows the device of FIG. 8 after etching through the windows in photoresist mask down through the fourth polysilicon layer, the ONO layer, the third polysilicon layer and the first polysilicon layer to form spaces below the windows extending down to expose the surface of the substrate producing the gate conductor stacks.

FIG. 10 shows the device of FIG. 9 during a LATI ion implantation at an angle of 45° of arsenic ions into source/drain regions self-aligned with the gate conductor stacks by a rotary LATI ion implantation process to implant under the tunnel oxide.

FIG. 11B also shows a view taken along line 11B–11B' in FIG. 11A of the flash memory device of this invention.

DESCRIPTION OF THE PREFERRED EMBODIMENT

FIGS. 1–10 are sectional views showing the process of forming a device 10 in accordance with this invention.

Figure 1:
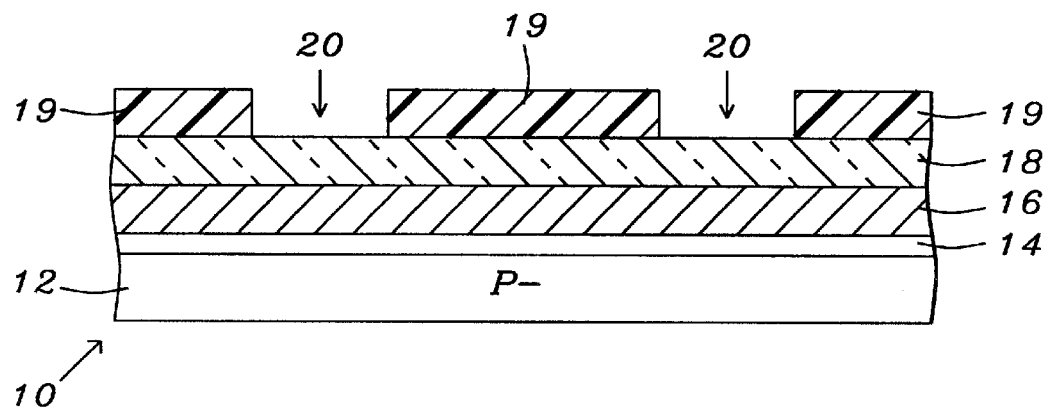
FIGS. 1–10 are sectional views showing the process of forming a device in accordance with this invention.

FIG. 1 shows a flash memory device 10 in accordance with this invention in an early stage of manufacture. A P-doped silicon semiconductor substrate 12 is coated with a conventional tunnel oxide layer 14. Alternatively, the substrate 12 can be an N-doped substrate or an N-well in a P-substrate depending upon product design choices; and the doped regions in FIG. 8 will be modified accordingly, as will be well understood by those skilled in the art.

The tunnel oxide layer 14, which is from about 80 Å to about 100 Å thick, is covered with a blanket layer of a first polysilicon (Poly I) conductor layer 16 (the initial floating gate layer) over the surface of tunnel oxide layer 14. The first polysilicon conductor layer 16 has a thickness of about 1,500 Å and layer 16 is formed by a CVD (Chemical Vapor Deposition) process of deposition from silane ($SiH_4$) gas mixed with nitrogen ($N_2$) gas in situ using phosphine ($PH_3$) gas for doping.

Next, form a silicon nitride ($Si_3N_4$) dielectric layer 18 from about 500 Å to about 1,000 Å thick over the layer 16.

Then the first polysilicon layer 16 is patterned by forming a photoresist mask 19, with windows 20 therethrough, over the silicon nitride ($Si_3N_4$) layer 18.

Figure 2:
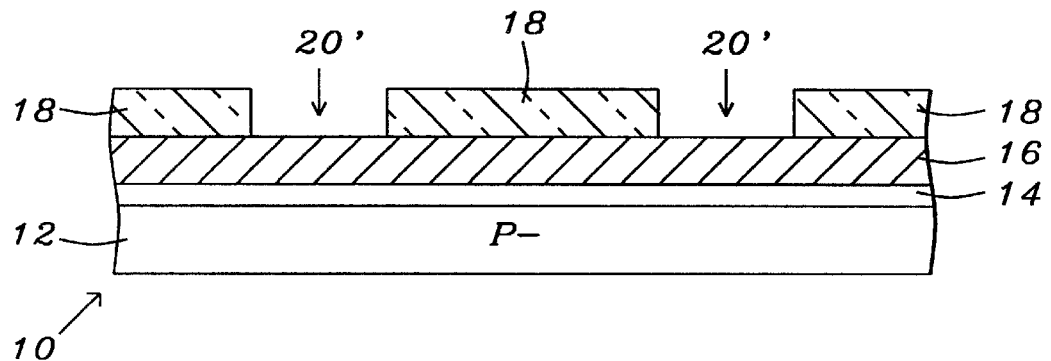

FIG. 2 shows the device 10 of FIG. 1 after patterning the silicon nitride ($Si_3N_4$) layer 18 by etching through openings 20 in mask 19 to produce windows 20' over portions of the first doped polysilicon layer 16; and after the photoresist mask 19 has been stripped from the silicon nitride ($Si_3 N_4$) layer 18. Layer 18 remains exposed through the new windows 20' in silicon nitride layer 18 over portions of the first polysilicon layer 16.

Figure 3:
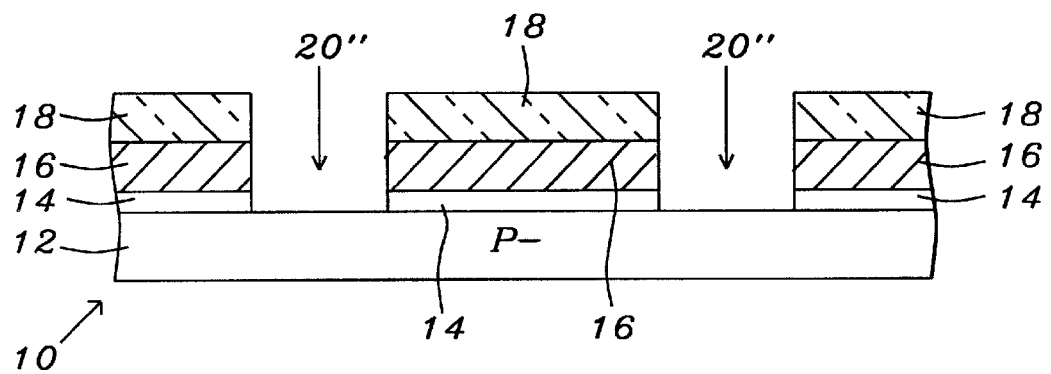

Referring to FIG. 3 device 10 of FIG. 2 is shown after etching through windows 20' to form slots 20" through layers 16 and 14 that extend through both first polysilicon layer 16 and tunnel oxide layer 14 below openings 20' in FIG. 2 to the top surface of substrate 12.

Figure 4:
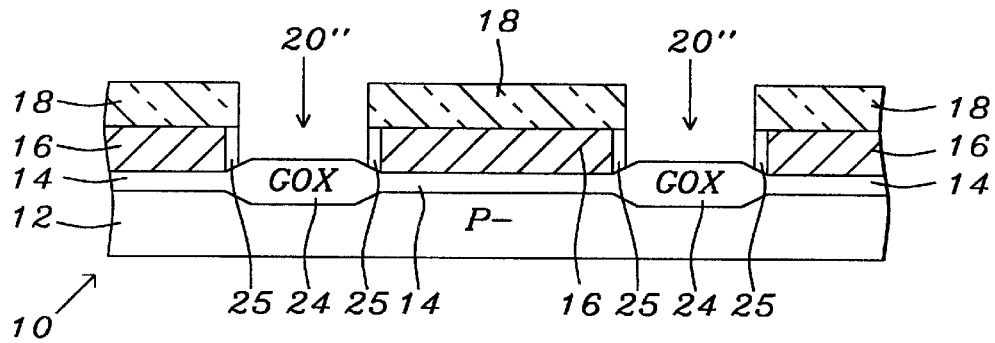

FIG. 4 shows the device of FIG. 3 after gate oxide (GOX) regions 24 were formed in and on the exposed surface of substrate 12 linking the sections of tunnel oxide (TOX) layer 14. GOX regions 24 are from about 150 Å to about 200 Å thick. The edges of the first polysilicon layer 16 have been oxidized in a process known as "re-ox" or "reoxidation" to form reoxidized polysilicon (polysilicon reoxide) which will be referred to hereinafter as polysilicon oxide sidewalls 25 on the edge of layer 16. The GOX regions 24 and the silicon oxide polysilicon oxide sidewalls 25 were formed by a conventional process of thermal oxidation. As can be seen the gate oxide regions 24 extend partially down into the doped silicon semiconductor substrate 12. The depression in substrate 12 formed by the formation of gate oxide regions 24 can be seen by reference to FIG. 3 where the surface of the substrate is shown being flat, as contrasted to the depression formed during the process of forming gate oxide regions 24.

Figure 5:
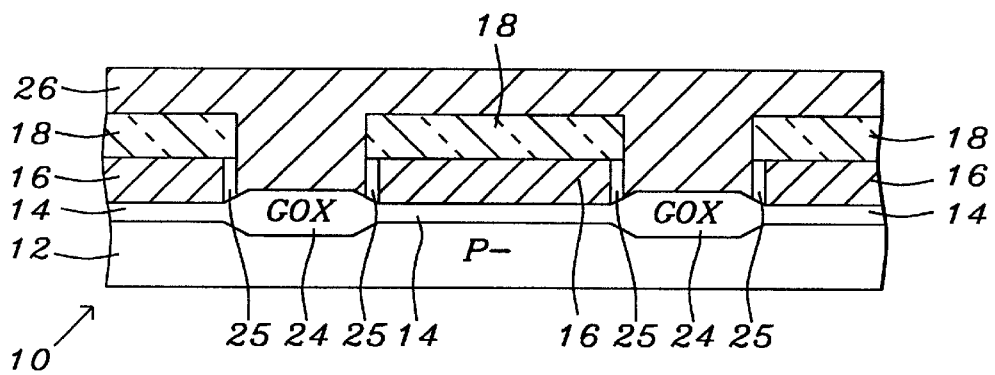

FIG. 5 shows the device 10 of FIG. 4 after a second doped polysilicon (Poly II) conductor layer 26 has been formed in a blanket deposition step covering the entire device 10 from about 3,000 Å to about 7,000 Å thick and filling slots 20" between the silicon oxide sidewalls 25. Second polysilicon layer 26 is formed by a CVD (Chemical Vapor Deposition) process of deposition from silane ($SiH_4$) gas, nitrogen ($N_2$) gas in situ using phosphine ($PH_3$) gas for doping.

Figure 6:
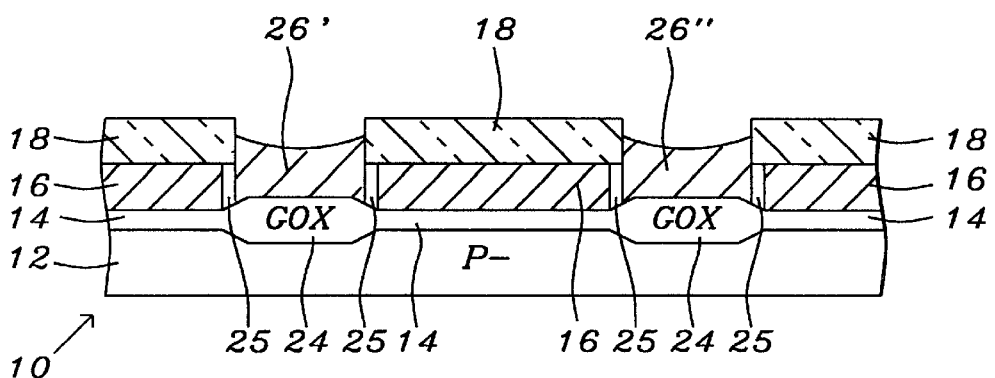

FIG. 6 shows the device 10 of FIG. 5 after the second polysilicon layer 26 is etched back to a thickness from about 1,500 Å to about 3,000 Å thick to fill the slots 20" (formed as shown in FIG. 3) with polysilicon stripes 26' and 26" patterned into convex shapes which are lower than the silicon nitride/first polysilicon stacks 18/16. The polysilicon stripes 26' and 26" are located between stacks 25/18/16 (silicon oxide sidewalls 25, silicon nitride layer 18 and first polysilicon layer 16).

Figure 7:
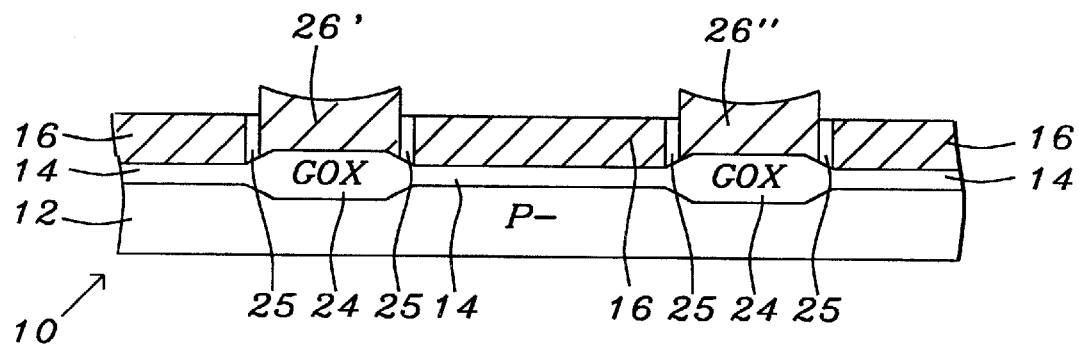

FIG. 7 shows the device 10 of FIG. 6 after the silicon nitride segments 18 have been stripped away from device 10 leaving the second polysilicon stripes 26' and 26" extending above the silicon oxide sidewalls 25 as well as reaching higher above the surface of the substrate 12 than the first polysilicon layer 16.

Figure 8:
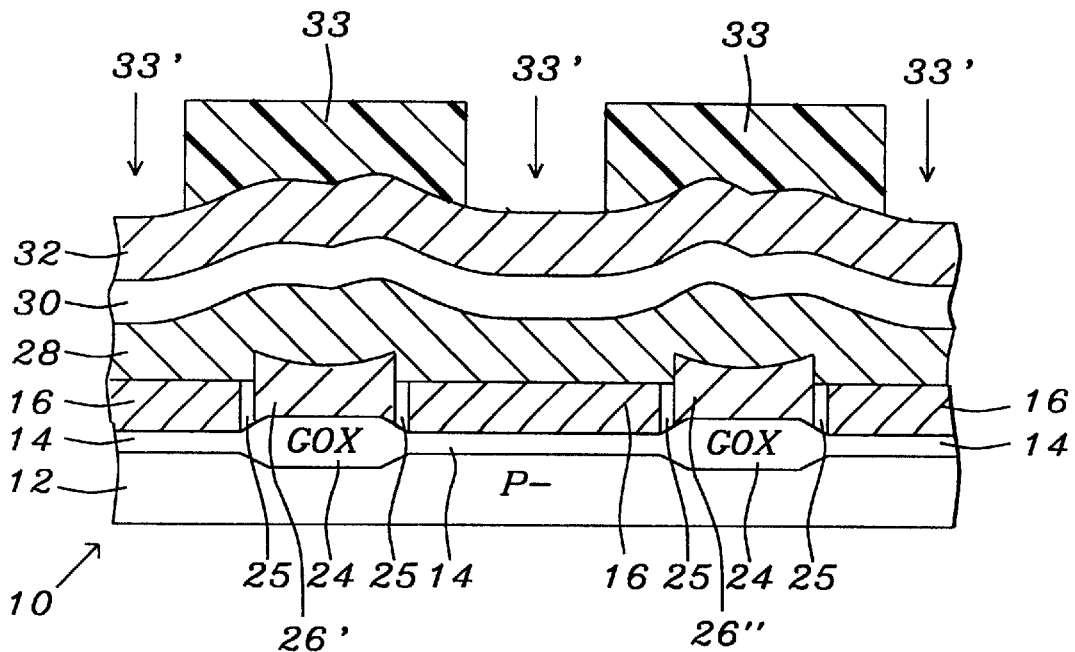

FIG. 8 shows the device of FIG. 7 after formation of a third polysilicon (Poly III) layer 28, a conventional ONO interconductor dielectric layer 30, a fourth polysilicon (Poly IV) word line layer 32, and a photoresist mask 33 (for patterning gate conductor stacks). Photoresist mask 33 has windows 33' therethrough extending down to the top surface of fourth polysilicon layer 32.

Third polysilicon layer 28 was formed from about 500 Å to about 1,000 Å thick by a CVD (Chemical Vapor Deposition) process of deposition from silane ($SiH_4$) gas, nitrogen ($N_2$) gas in situ using phosphine ($PH_3$) gas for doping.

ONO interconductor dielectric layer 30 preferably consists of Oxide Nitride Oxide (ONO) with a thickness of about 60 Å of silicon Oxide, a thickness of about 40 Å of silicon Nitride, and a thickness of about 60 Å of silicon Oxide which was deposited in a conventional manner.

Fourth polysilicon layer 32 was formed about 1,500 Å thick by a CVD (Chemical Vapor Deposition) process of deposition from silane ($SiH_4$) gas, nitrogen ($N_2$) gas in situ using phosphine ($PH_3$) gas for doping.

Figure 9:
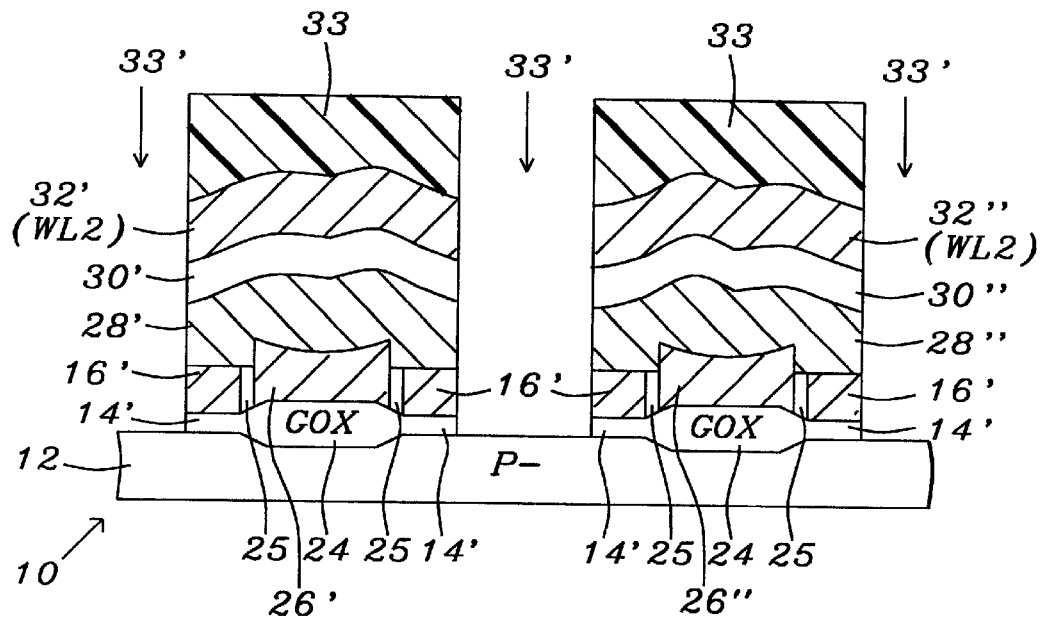

FIG. 9 shows the device of FIG. 8 after etching through windows 33' in photoresist mask 33 down through the fourth polysilicon layer 32, ONO layer 30, third polysilicon layer 32 and first polysilicon layer 16 to form spaces below the windows 33' extending down to expose the surface of substrate 12 producing the pair of gate conductor stacks 36. The two stacks 36 include the floating gates composed of floating gate lateral sections 16' of the first polysilicon layer 16, floating gate stripes 26' and 26" of the second polysilicon layer 26, and floating gate caps 28' and 28" of the third polysilicon layer 28. Above the floating gates, are the ONO regions 30' and 30" of the ONO layer 30 on which the control gates 32' and 32" are formed from the fourth polysilicon layer 32.

Figure 10:
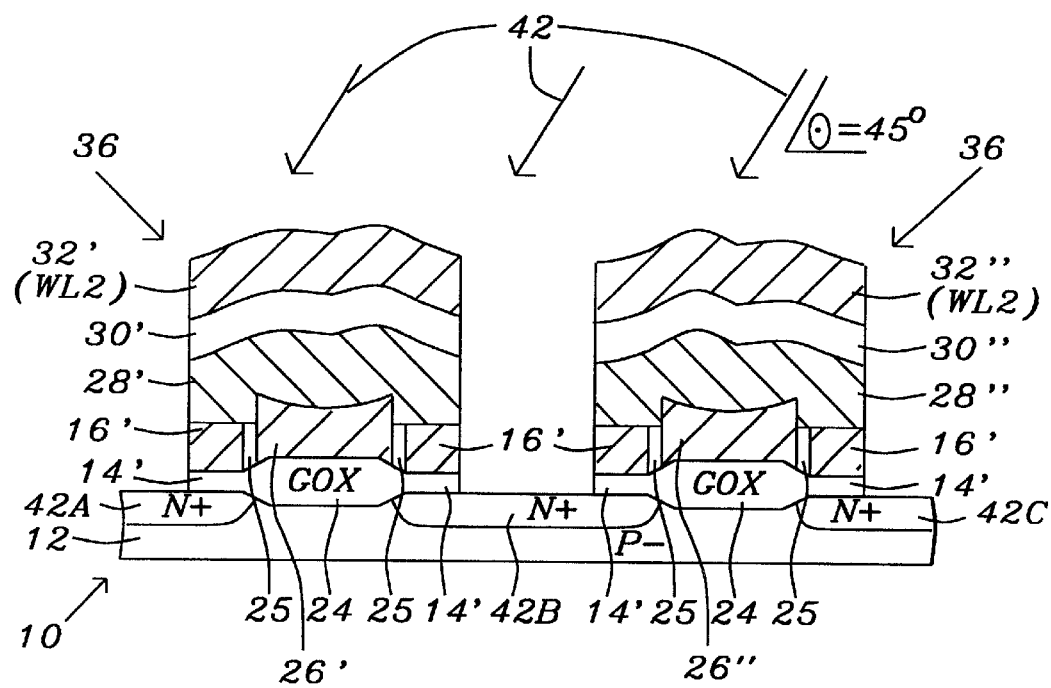

FIG. 10 shows the device of FIG. 9 during a LATI ion implantation at an angle of 45° of arsenic ions 42 into source/drain (S/D) regions 42A, 42B, and 42C self-aligned with the gate conductor stacks 36 by a rotary LATI ion implantation process to implant under the tunnel oxide 14 at an approximate angle Θ=45° of incidence relative to the surface of device 10. Because of the angle of incidence and the low elevation of the layers of device 10 (which are exaggerated in the drawing) ions reach underneath the layers above to the degree afforded by the geometry. It will be well understood by one skilled in the art that the angle Θ is selected for any given design by the geometry of the product being manufactured. The source region 42B and drain regions 42A and 42C extend under the tunnel oxide regions 14' to the junction thereof with the gate oxide regions.

The arsenic dopant 42 is implanted preferably with a dose of about 5E15 ions/$cm^2$ at an energy from about 60 keV to about 80 keV. If desired, a range of arsenic (As) dopant can range from about 1E15 ions/$cm^2$ to about 6E15 ions/$cm^2$.

A thermal drive in is performed to diffuse source/drain dopant into the device 10. After annealing the dopant the resulting concentration in the source/drain regions is 42A, 42B, and 42C preferably from about 1E19 atoms/$cm^3$ to about 1E20 atoms/$cm^3$.

The conventional back-end process follows as will be well understood by those skilled in the art.

Charge protection is provided by the structure including the first polysilicon floating gate lateral sections 16' that are separated from second polysilicon floating gate stripes 26' and 26" (over the GOX regions 24) by the silicon oxide sidewalls 25 to serve as a dielectric bordering floating gate stripes 26' and 26".

Figure 11A:
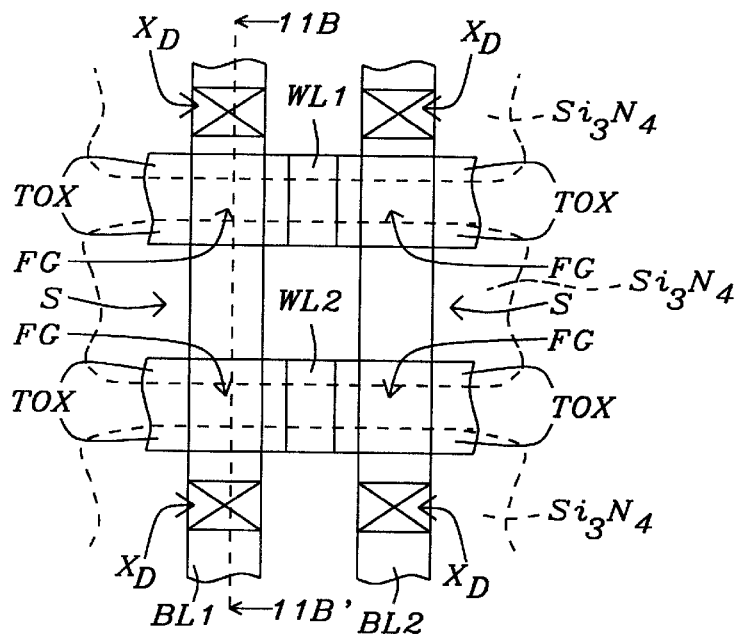
FIG. 11A shows a plan view of a layout of flash memory device in accordance with this invention with silicon nitride regions shown in phantom, tunnel oxide regions, source regions, drain contacts, and floating gate regions.

FIG. 11A shows a plan view of a layout of the flash memory device in accordance with this invention with $Si_3N_4$ regions shown in phantom, tunnel oxide regions TOX, source regions S, drain contacts $X_D$, and floating gate regions FG.

Figure 11B:
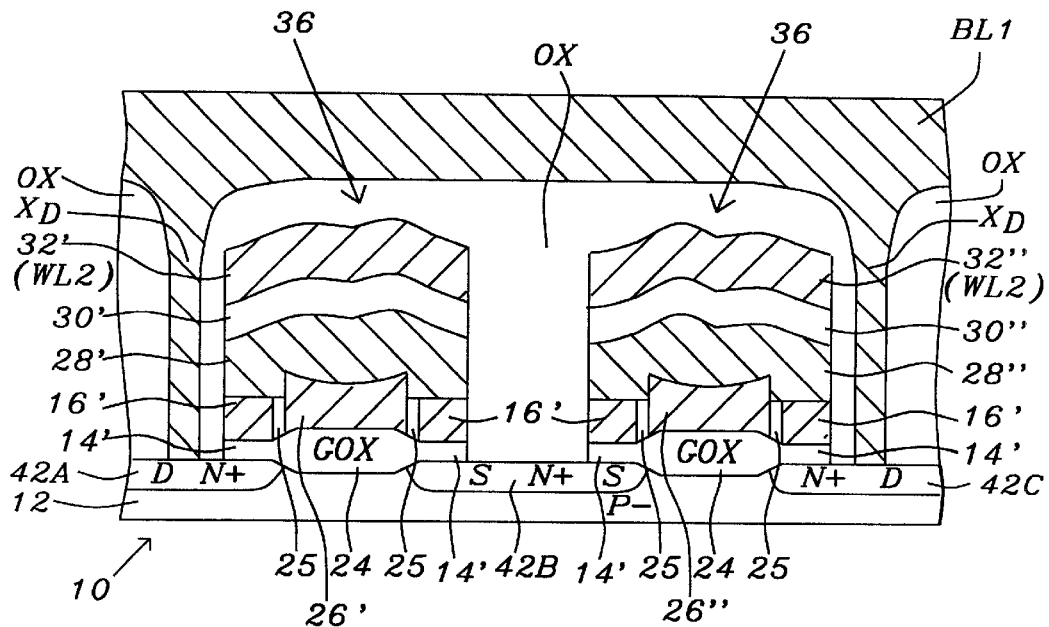
FIG. 11B shows a sectional of the device of FIG. 10 after formation of an oxide layer thereover and formation of bit line contacts to the drain regions.

The bit lines BL1 and BL2 are buried bit lines which extend vertically as shown in FIG. 11A crossing over gate conductor stacks 36 as shown in FIG. 11B.

The word lines WL1 and WL2 are connected to the control gate electrodes and are above the floating gate regions FG.

FIG. 11B shows a sectional of the flash memory device 10 of FIG. 10 after formation of a silicon oxide layer OX thereover and formation of bit line contacts to the drain regions. FIG. 11B also shows a view taken along line 11B–11B' in FIG. 11A of the flash memory device 10 of this invention. The silicon oxide layer OX covers the exposed surfaces of the gate conductor stacks 36, the exposed surfaces of the the drain regions 42A and 42C and covers the entire exposed surface of the source region 42B aside from the tunnel oxide (TOX) regions 14'. Holes to drain bit line contacts $X_D$ seen in FIG. 11A have been formed through the silicon oxide layer 36 down to the drain regions 42A and 42C. The conductive bit line BL1, which covers the silicon oxide layer OX, also fills the holes and thus covers the drain contacts $X_D$ by reaching down into contact with drain region 42A and drain region 42C. The contacts $X_D$ of the conductive drain contact line DC are connected electrically and mechanically in intimate contact with the top surfaces of the drain regions 42A and 42C. As can be seen, and as explained above in connection with FIG. 4, as can be seen by reference to FIG. 3, the gate oxide regions 24 extend partially down into the doped silicon semiconductor substrate 12. In addition, the two gate stacks 36 are located side by side with a single, common source region 42B formed therebetween. As stated above the silicon oxide layer OX reaches directly down into contact with the source region 42B since the tunnel oxide layer 14 is interrupted between the gate electrode stacks 36 forming individual TOX regions 14'.

Figures 12A, 12B:
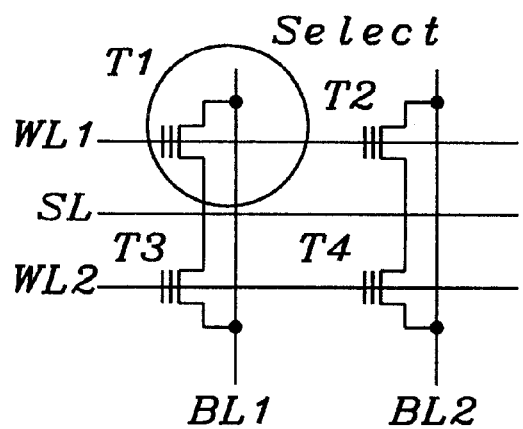
FIG. 12A shows a circuit diagram of a cell of EEPROM devices in accordance with this invention.
FIG. 12B shows an operation table for the device of FIG. 12A.

FIG. 12A shows a circuit diagram of a cell of EEPROM devices T1, T2, T3 and T4 in accordance with this invention. T1 is the select transistor.

Bit line BL1 connects to the drains of transistors T1 and T3. Word line WL1 connects to the control gate of transistors T1 and T2.

Bit line BL2 connects to the drains of transistors T2 and T4. Word line WL2 connects to the control gate of transistors T3 and T4.

FIG. 12B shows an operation table for the device of FIG. 12A.

ADVANTAGES

1. The process of this invention produces a device with a high Coupling Ratio (CR) achieved by a non-uniform gate oxide.

Coupling Ratio $$CR = \frac{C_{FG}}{C_T}$$

where
$C_{FG}$=the capacitance between the floating gate and the control gate
$C_T$=Total capacitance.
2. The Large Tilted Angle Implant (LATI) process is used to extend the N+ dopant regions to the thicker gate oxide in order to reduce band-to-ban tunneling leakage current.
3. The invention is CMOS compatible with an additional mask.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A semiconductor memory device with a gate electrode stack including a floating gate electrode, an interelectrode dielectric layer and a control gate electrode comprising:

the interelectrode dielectric layer is formed on top of the floating gate electrode and the control gate electrode is formed on top of the interelectrode dielectric layer, a doped silicon semiconductor substrate covered with variable thickness silicon oxide regions including tunnel oxide regions on the surface thereof and a gate oxide region extending partially down into the doped silicon semiconductor substrate, the gate oxide region being located between tunnel oxide regions with junctions between the the gate oxide region and the tunnel oxide regions, the gate oxide region being substantially thicker than the tunnel oxide regions and being located beneath the center of the floating gate electrode, source/drain regions in the substrate extending beneath the tunnel oxide regions with the source/drain regions being aligned with the gate electrode stack, and the floating gate electrode being formed over the silicon oxide regions above the source/drain regions including dielectric sidewalls within the floating gate electrode above the junctions between the tunnel oxide regions and the gate oxide region, wherein the dielectric sidewalls do not form on a planar upper surface of the gate oxide region.

2. The device of claim 1 wherein:

the variable thickness silicon oxide regions comprise tunnel oxide regions on either side of the gate oxide region, the floating gate electrode is composed of doped polysilicon and the dielectric sidewalls comprise polysilicon oxide dielectric regions formed within the floating gate electrode above the junctions of the tunnel oxide regions and the gate oxide region.

3. The device of claim 1 wherein:

the variable thickness silicon oxide regions comprise tunnel oxide regions on either side of a gate oxide region, the floating gate electrode is composed of doped polysilicon and the dielectric sidewalls comprise polysilicon oxide dielectric regions formed within the floating gate electrode above the junctions of the tunnel oxide regions and the gate oxide region, and the tunnel oxide regions have a thickness from about 80 Å to about 100 Å and the gate oxide region have a thickness from about 150 Å to about 200 Å.

4. The device of claim 1 wherein:

the variable thickness silicon oxide regions comprise tunnel oxide regions on either side of a gate oxide region, the floating gate electrode is composed of doped polysilicon and the dielectric sidewalls comprising polysilicon oxide dielectric regions formed within the floating gate electrode above the junctions of the tunnel oxide regions and the gate oxide region, and the floating gate is formed with sections reaching down on either side of the polysilicon oxide dielectric regions to the gate oxide region layer and to the tunnel oxide region.

5. The device of claim 1 wherein:

the variable thickness silicon oxide regions comprise tunnel oxide regions on either side of the gate oxide region, the floating gate electrode is composed of doped polysilicon and the dielectric sidewalls comprising polysilicon oxide dielectric regions formed within the floating gate electrode above the junctions of the tunnel oxide regions and the gate oxide region, and the silicon oxide comprises a tunnel oxide layer with a thickness from about 80 Å to about 100 Å and a gate oxide layer with a thickness from about 150 Å to about 200 Å.

6. The device of claim 1 wherein the tunnel oxide regions have a thickness from about 80 Å to about 100 Å and the gate oxide region has a thickness from about 150 Å to about 200 Å.

7. A semiconductor memory device including a gate electrode stack formed of a floating gate electrode, an interelectrode dielectric layer and a control gate electrode comprising:

a doped silicon semiconductor substrate having alternating silicon oxide regions formed on the surface thereof, the alternating silicon oxide regions comprising alternating tunnel oxide regions and a gate oxide region which extend partially down into the doped silicon semiconductor substrate formed on the surface of the substrate and the gate oxide region is substantially thicker than the tunnel oxide regions with junctions between the tunnel oxide regions and the gate oxide region, the floating gate electrode centered over the gate oxide region and over the tunnel oxide regions on either side of the gate oxide region, source/drain regions in the substrate extending beneath the tunnel oxide regions, the floating gate electrode comprising a three part floating gate electrode composed of laminated first, second and third parts, the interelectrode dielectric layer covering the floating gate electrode, the control gate electrode formed covering the interelectrode dielectric layer, the first part of the floating gate is formed over the tunnel oxide regions above the source/drain regions with end walls above the junction, and silicon oxide sidewalls formed on the end walls of the first part between the first part and the second part, wherein the silicon oxide sidewalls do not form on a planar surface of gate oxide region.

8. The device of claim 7 wherein the floating gate electrode is composed of doped polysilicon and includes polysilicon oxide dielectric regions formed on the end walls in the floating gate electrode above the junctions of the tunnel oxide regions and the gate oxide region.

9. The device of claim 7 wherein:

the laminated first part, the second part and the third part of the floating gate electrode are composed of doped polysilicon and the floating gate electrode includes polysilicon oxide dielectric regions formed in the floating gate electrode above the junctions of the tunnel oxide regions and the gate oxide region, and the tunnel oxide regions have a thickness from about 80 Å to about 100 Å and the gate oxide region has a thickness from about 150 Å to about 200 Å.

10. The device of claim 7 wherein:

the floating gate electrode is composed of doped polysilicon and includes polysilicon oxide dielectric regions formed in the floating gate electrode above the junctions of the tunnel oxide regions and the gate oxide region, and the floating gate electrode is formed with sections reaching down on either side of the polysilicon oxide dielectric regions to the gate oxide region and to the tunnel oxide region respectively.

11. The device of claim 7 wherein the tunnel oxide regions have a thickness from about 80 Å to about 100 Å and the gate oxide region has a thickness from about 150 Å to about 200 Å.

12. A semiconductor memory device including:

a doped silicon semiconductor substrate with source/drain regions formed in the surface thereof with an oxide layer formed on the substrate beneath a gate conductor stack, the gate conductor stack comprising a control gate electrode formed over an interelectrode dielectric layer formed in turn over a three part floating gate electrode formed of laminated first, second and third doped polysilicon layer parts formed in turn over the oxide layer, the oxide layer comprising a gate oxide region and tunnel oxide regions formed on the surface of the substrate below and aligned with the gate conductor stack, with the gate oxide region extending partially down into the doped silicon semiconductor substrate and located between the source/drain regions beneath the gate conductor stack and with the tunnel oxide regions located over the substrate above the source/drain regions beside the gate oxide region, with a junction located between the gate oxide region and the tunnel oxide regions and with the source region and drain regions extending under the tunnel oxide regions to the junction, the first doped polysilicon layer part is formed over the tunnel oxide regions above the source/drain regions with end walls above the junction, silicon oxide sidewalls formed on the end walls of the first doped polysilicon layer part between the first doped polysilicon layer part and the second doped polysilicon layer part wherein the silicon oxide sidewalls do not form on a planar upper surface of gate oxide region, the second doped polysilicon layer part is formed above the gate oxide layer, and the third doped polysilicon layer is formed above the first doped polysilicon layer part, above the silicon oxide sidewalls, and above the second doped polysilicon layer part laminating the first doped polysilicon part together with the second doped polysilicon part to form the floating gate electrode.

13. The device of claim 12 wherein:

the silicon oxide sidewalls are formed by polysilicon oxide dielectric regions, and the floating gate electrode is formed with sections reaching down on either side of the polysilicon oxide dielectric regions to the gate oxide region and to the tunnel oxide regions.

14. The device of claim 12 wherein:

the silicon oxide sidewalls comprise polysilicon oxide dielectric regions formed in the floating gate electrode above the junctions of the tunnel oxide regions and the gate oxide region, and the tunnel oxide regions have a thickness from 80 Å to 100 Å and the gate oxide region has a thickness from 150 Å to 200 Å.

15. The device of claim 1 wherein:

the variable thickness silicon oxide regions comprise tunnel oxide regions on either side of a gate oxide region, the floating gate electrode is composed of doped polysilicon oxide, polysilicon oxide dielectric regions formed in the floating gate electrode above the junctions of the tunnel oxide regions and the gate oxide region, the dielectric sidewalls comprise polysilicon oxide dielectric regions formed in the floating gate electrode above the junctions between the tunnel oxide regions and the gate oxide region, and the tunnel oxide regions have a thickness from 80 Å to 100 Å and the gate oxide region has a thickness from 150 Å to 200 Å.

* * * * *